(12) United States Patent
Falk et al.

(10) Patent No.: US 11,048,023 B2
(45) Date of Patent: Jun. 29, 2021

(54) TUNABLE HYPERBOLIC METAMATERIALS

(71) Applicant: International Business Machines Corporation, Armonk, NY (US)

(72) Inventors: Abram L. Falk, Port Chester, NY (US); Damon Brooks Farmer, White Plains, NY (US); Jessie Carrigan Rosenberg, Mount Vernon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/541,876

(22) Filed: Aug. 15, 2019

(65) Prior Publication Data

US 2021/0048558 A1 Feb. 18, 2021

(51) Int. Cl.
*G02B 1/00* (2006.01)
*H01L 45/00* (2006.01)

(52) U.S. Cl.
CPC .............. *G02B 1/002* (2013.01); *H01L 45/06* (2013.01); *H01L 45/1213* (2013.01); *H01L 45/141* (2013.01)

(58) Field of Classification Search
None
See application file for complete search history.

(56) References Cited

U.S. PATENT DOCUMENTS

| | | | |
|---|---|---|---|
| 7,522,124 B2 | 4/2009 | Smith et al. | |
| 9,151,891 B2 | 10/2015 | Ma et al. | |
| 9,203,155 B2 | 12/2015 | Choi et al. | |
| 9,851,589 B2 | 12/2017 | Han et al. | |
| 2009/0040132 A1 | 2/2009 | Sridhar et al. | |
| 2012/0326944 A1* | 12/2012 | Choi | H01Q 15/0086 343/909 |
| 2013/0340990 A1 | 12/2013 | Smolyaninov et al. | |
| 2017/0045759 A1 | 2/2017 | Han et al. | |

OTHER PUBLICATIONS

J. Yao et al., "Optical Negative Refraction in Bulk Metamaterials of Nanowires," Science, Aug. 15, 2008, p. 930, vol. 321.
C. Rizza et al., "Terahertz Active Spatial Filtering Through Optically Tunable Hyperbolic Metamaterials," Optics Letters, Aug. 15, 2012, pp. 3345-3347, vol. 37, No. 16.
H.N.S. Krishnamoorthy et al., "Tunable Hyperbolic Metamaterials Utilizing Phase Change Heterostructures," Applied Physics Letters, Mar. 10, 2014, 6 pages, vol. 104.
S. Dai et al., "Graphene on Hexagonal Boron Nitride as a Tunable Hyperbolic Metamaterial," Nature Nanotechnology, Aug. 2015, pp. 682-687, vol. 10.

* cited by examiner

*Primary Examiner* — Jay C Chang
(74) *Attorney, Agent, or Firm* — Anthony Curro; Ryan, Mason & Lewis, LLP

(57) ABSTRACT

An apparatus includes an array of metal nanowires embedded in a matrix of optically tunable material providing a tunable hyperbolic metamaterial, and a control circuit including (i) a current source coupled to first ends of the array of metal nanowires and (ii) a ground voltage coupled to second ends of the array of metal nanowires. The control circuit is configured to modify a state of the optically tunable material utilizing current supplied between the first and second ends of the array of metal nanowires to dynamically reconfigure optical properties of the tunable hyperbolic metamaterial.

20 Claims, 12 Drawing Sheets

TUNABLE HYPERBOLIC METAMATERIALS

BACKGROUND

The present application relates to optics, and more specifically, to techniques for forming metamaterials. Metamaterials are nanostructured materials, often with a repeating nanoscale pattern, that are engineered to have optical properties. The nanoscale pattern of a metamaterial is designed to be significantly smaller than a designated wavelength of light that the metamaterial is intended to operate on, so that the metamaterial functions as an effective medium. This means that, although the nanoscale patterns influence the optical properties of the metamaterial, they do not scatter light having the designated wavelength. In a hyperbolic metamaterial, the optical properties of the metamaterial are highly anisotropic, such that the optical-frequency dielectric tensor has both positive and negative principle components.

SUMMARY

Embodiments of the invention provide techniques for forming tunable hyperbolic metamaterials.

In one embodiment, an apparatus comprises an array of metal nanowires embedded in a matrix of optically tunable material providing a tunable hyperbolic metamaterial, and a control circuit comprising (i) a current source coupled to first ends of the array of metal nanowires and (ii) a ground voltage coupled to second ends of the array of metal nanowires. The control circuit is configured to modify a state of the optically tunable material utilizing current supplied between the first and second ends of the array of metal nanowires to dynamically reconfigure optical properties of the tunable hyperbolic metamaterial.

In another embodiment, a semiconductor structure comprises a substrate, a matrix of optically tunable material disposed over the substrate, an array of metal nanowires embedded in the matrix of optically tunable material, a current source coupled to first ends of the array of metal nanowires, and a ground voltage coupled to second ends of the array of metal nanowires. The semiconductor structure provides a tunable hyperbolic metamaterial having one or more optical properties dynamically reconfigurable based on a state of the optically tunable material.

In another embodiment, a method comprises selecting a designated set of one or more optical properties of a tunable hyperbolic metamaterial, the tunable hyperbolic metamaterial comprising an array of metal nanowires embedded in a matrix of optically tunable material. The method also comprises modifying a state of the optically tunable material utilizing current supplied between first and second ends of the array of metal nanowires to dynamically reconfigure the tunable hyperbolic metamaterial to have the designated set of one or more optical properties.

DETAILED DESCRIPTION

Illustrative embodiments of the invention may be described herein in the context of illustrative methods for forming tunable hyperbolic metamaterials. However, it is to be understood that embodiments of the invention are not limited to the illustrative methods, apparatus, systems and devices but instead are more broadly applicable to other suitable methods, apparatus, systems and devices.

Metamaterials, as noted above, are nanostructured materials with a repeating nanoscale pattern engineered to have certain desired optical properties (e.g., optical properties that are difficult to achieve in true crystals). The nanoscale patterns of metamaterials may be designed to be significantly smaller than a designated wavelength of light that the metamaterial will be operated with, such that the nanoscale patterns influence the optical properties of the metamaterial without scattering light having the designated wavelength.

Hyperbolic metamaterials are a type of metamaterial that have dielectric-like optical properties along some axes and metal-like optical properties along other axes (e.g., dielectric-like optical properties in one or two directions or axes, and metal-like optical properties in other directions or axes). Formally, the principal values of a hyperbolic metamaterial's permittivity tensor has one or two positive values, and one or two negative values. The name "hyperbolic metamaterial" originates from the fact that isofrequency surfaces in hyperbolic metamaterials can be plotted as two-dimensional (2D) hyperboloids in a three-dimensional (3D) space.

Hyperbolic metamaterials may be used for a wide variety of applications, including enhancing spontaneous emission, improving heat transport and acoustics, subwavelength imaging, subwavelength focusing (e.g., focusing light to smaller dimensions than free-space diffraction limits would allow), etc. A hyperbolic metamaterial, in some embodiments, is used to enhance fluorescence for light sources like emitters or, in the reverse, to provide enhanced photodetectors. Hyperbolic metamaterials may also be designed to provide a material where light of a designated wavelength refracts in an opposite direction as the material would otherwise provide. It is to be appreciated that the above-described applications for hyperbolic metamaterials are presented by way of example only, and that embodiments are not limited to use in these specific applications.

There is a need for creating hyperbolic metamaterials that are tunable, meaning that the optical properties of the hyperbolic metamaterial or portions thereof can be altered dynamically. Illustrative embodiments provide techniques for forming tunable hyperbolic metamaterials.

In some embodiments, a tunable hyperbolic metamaterial is formed from a 2D array of metal nanowires, such as a type-I hyperbolic metamaterial, surrounded by an optically tunable material such as a phase-change material (PCM). PCMs such as chalcogenide PCMs can be switched between a crystalline phase and an amorphous phase via thermal pulses. In some embodiments, Joule heating provides the source of heat for the thermal pulses via current pulses applied to the 2D metal nanowire array. Illustrative embodiments therefore provide electrically tunable hyperbolic metamaterials.

Current pulses may be used to switch PCM for a variety of applications, such as in PCM memory. In PCM memory and other applications, it can be difficult to switch large blocks of PCM due to filamentation effects that can distort the current path in the PCM. The 2D array of metal nanowires used in some embodiments, however, plays a dual role as a component of optical material and as current guides for the Joule heating pulses. Thus, because the electrical current is concentrated in the metal nanowires, filamentation effects are not a concern (e.g., they are reduced or eliminated).

Figure 1A:
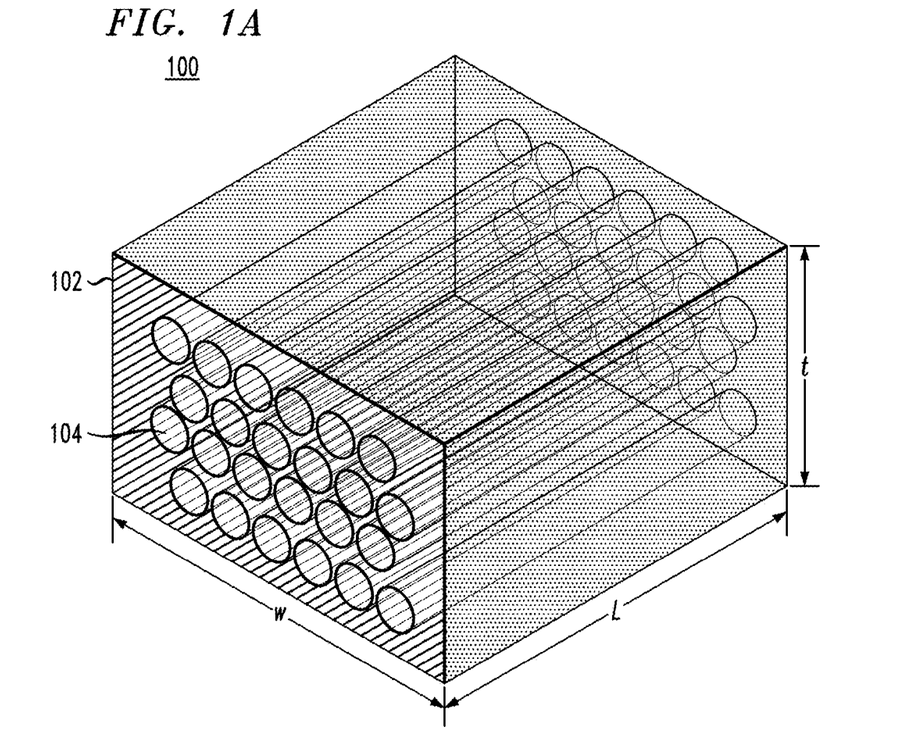
FIG. 1A depicts a perspective view of a tunable hyperbolic metamaterial, according to an embodiment of the invention.
Figure 1B:
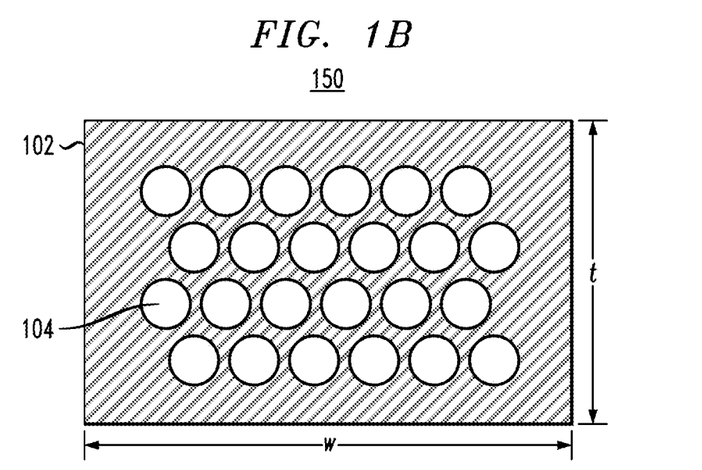
FIG. 1B depicts a side cross-sectional view of the FIG. 1A tunable hyperbolic metamaterial, according to an embodiment of the invention.

FIG. 1A shows a perspective view 100 of a tunable hyperbolic metamaterial, and FIG. 1B shows a side cross-sectional view 150 of the tunable hyperbolic metamaterial. The tunable hyperbolic metamaterial includes a 2D array of metal nanowires 104 embedded in a matrix 102. The matrix 102, in some embodiments, comprises an optically tunable material such as a PCM, where the PCM may be an amorphous-to-crystalline PCM such as a chalcogenide PCM. The phase transition of chalcogenide PCMs is thermally driven, and bi-stable at room temperature. Advantageously, the index of refraction of chalcogenide PCM is different in the two phases (e.g., the chalcogenide PCM has a first index of refraction in its amorphous phase and a second index of refraction different than the first index of refraction in its crystalline phase). Chalcogenide PCMs include, but are not limited to, germanium antimony telluride ($Ge_xSb_yTe_z$), germanium telluride ($Ge_xTe_y$), antimony telluride ($Sb_xTe_y$), silver antimony telluride ($Ag_xSb_yTe_z$), silver indium antimony telluride ($Ag_wIn_xSb_yTe_z$), etc. In some embodiments, $Sb_2Te_3$ is used as the PCM. In other embodiments, $Ge_2Sb_2Te_5$ or another chalcogenide PCM is used.

The optically tunable material used for the matrix 102, however, is not limited to chalcogenide PCM or PCM. In some embodiments, the optically tunable material used for the matrix 102 comprises a metal-insulator transition material (e.g., vanadium dioxide ($VO_2$), etc.), an ion-driven electrochromic material such as tungsten oxide ($WO_3$), etc. While various embodiments are described below in the context of using a PCM as the tunable optical material, it should be appreciated that the PCM may be replaced with these alternatives as desired for a particular implementation.

The metal nanowires 104 may be carbon nanotubes or another suitable material such as silver (Ag), gold (Au), aluminum (Al), titanium nitride (TiN), etc. Each of the metal nanowires may have a diameter in the range of 0.5 nm to 20 nm.

Each of the metal nanowires 104, in some embodiments, provides an antenna with a well-defined length denoted L in the range of 10 nm to 2000 nm. Thus, the hyperbolic metamaterial of FIG. 1A can function as a hyperbolic metamaterial antenna. The hyperbolic metamaterial shown in FIGS. 1A and 1B may have a width denoted w of 20 nm or greater, and a height or thickness denoted t in the range of 1 nm to 500 nm.

The PCM 102 is configured to be switched between two or more states, such as between a crystalline state or phase and an amorphous state or phase, with different associated optical properties. Thus, by modifying the state or phase of the PCM 102, the optical properties of the hyperbolic metamaterial may be tuned.

Figure 2A:
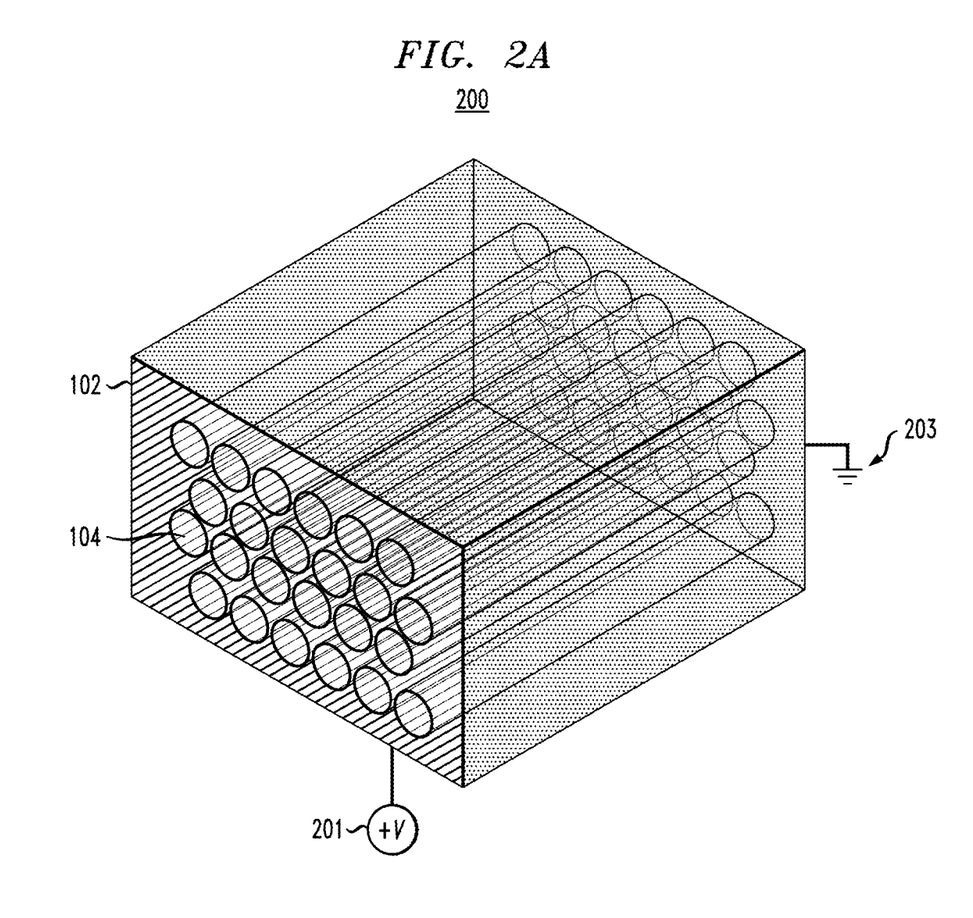
FIG. 2A depicts a perspective view of a tunable hyperbolic metamaterial connected to a current source and a ground voltage, according to an embodiment of the invention.
Figure 2B:
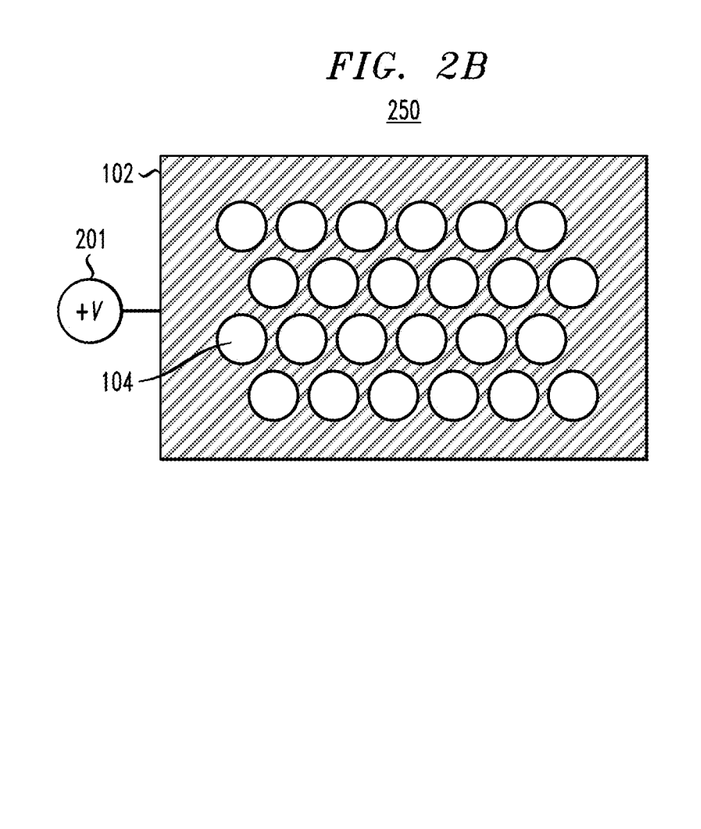
FIG. 2B depicts a first side cross-sectional view of the FIG. 2A tunable hyperbolic metamaterial, according to an embodiment of the invention.
Figure 2C:
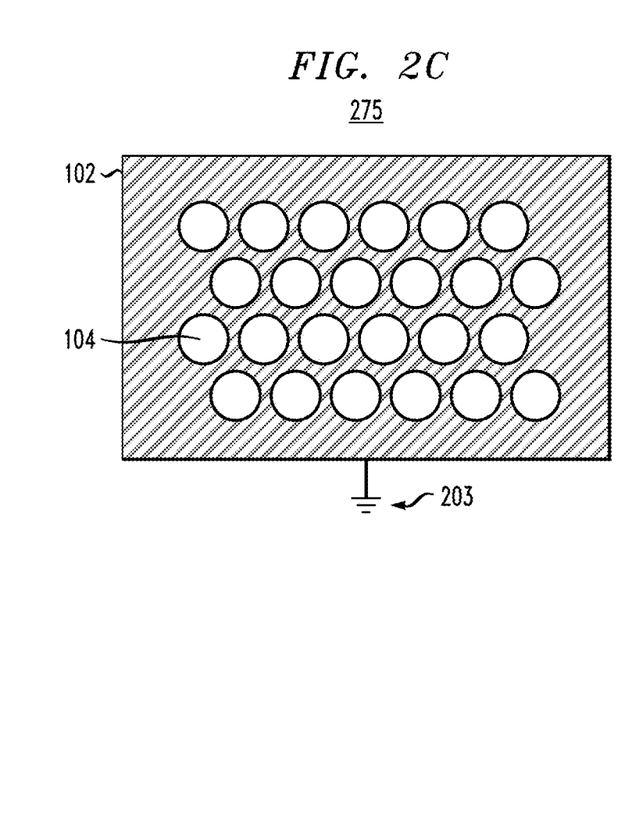
FIG. 2C depicts a second side cross-sectional view of the FIG. 2A tunable hyperbolic metamaterial, according to an embodiment of the invention.

FIG. 2A shows a perspective view 200 of the tunable hyperbolic metamaterial shown in FIGS. 1A and 1B, with a current source 201 applied (e.g., a voltage applied selectively via one or more switches) at one end of the metal nanowires 104 of the tunable hyperbolic metamaterial and the other end of the metal nanowires 104 of the tunable hyperbolic metamaterial being coupled to a ground voltage 203 (e.g., an electrical ground). The current source 201 is also referred to herein a voltage source 201. In the description below, the end of the metal nanowires 104 of the tunable hyperbolic metamaterial that the voltage source 201 is applied to will be referred to as a "front" and the end of the tunable hyperbolic metamaterial that the ground voltage 203 is coupled to will be referred to as the "back." The designation of "front" and "back" ends, however, is arbitrary. The voltage source 201 and ground voltage 203 are coupled to opposing ends of the metal nanowires 104, with those ends being referred to as the front and back herein. FIGS. 2B and 2C show first and second side-cross sectional views 250 and 275, respectively, of the tunable hyperbolic metamaterial shown in FIG. 2A. The first side cross-sectional view 250 of FIG. 2B is taken along the front end and the second side cross-sectional view 275 of FIG. 2C is taken along the back end.

To tune the hyperbolic metamaterial shown in FIGS. 2A-2C, Joule heating is used. A voltage is applied via the voltage source 201 to the "front" ends of the metal nanowires 104, which causes a current to flow through the metal nanowires 104 to the "back" ends of the metal nanowires 104 to the ground voltage 203. This creates Joule heating, which spreads to the surrounding PCM 102 and can thermally switch the phase of the PCM 102 (e.g., between crystalline and amorphous phases). As the PCM 102 is switched between its crystalline and amorphous phases, the optical properties of the tunable hyperbolic metamaterial change. Such optical properties include the index of refraction and the transparency of the tunable hyperbolic metamaterial (e.g., which may be a tunable hyperbolic antenna as described above).

Figure 3:
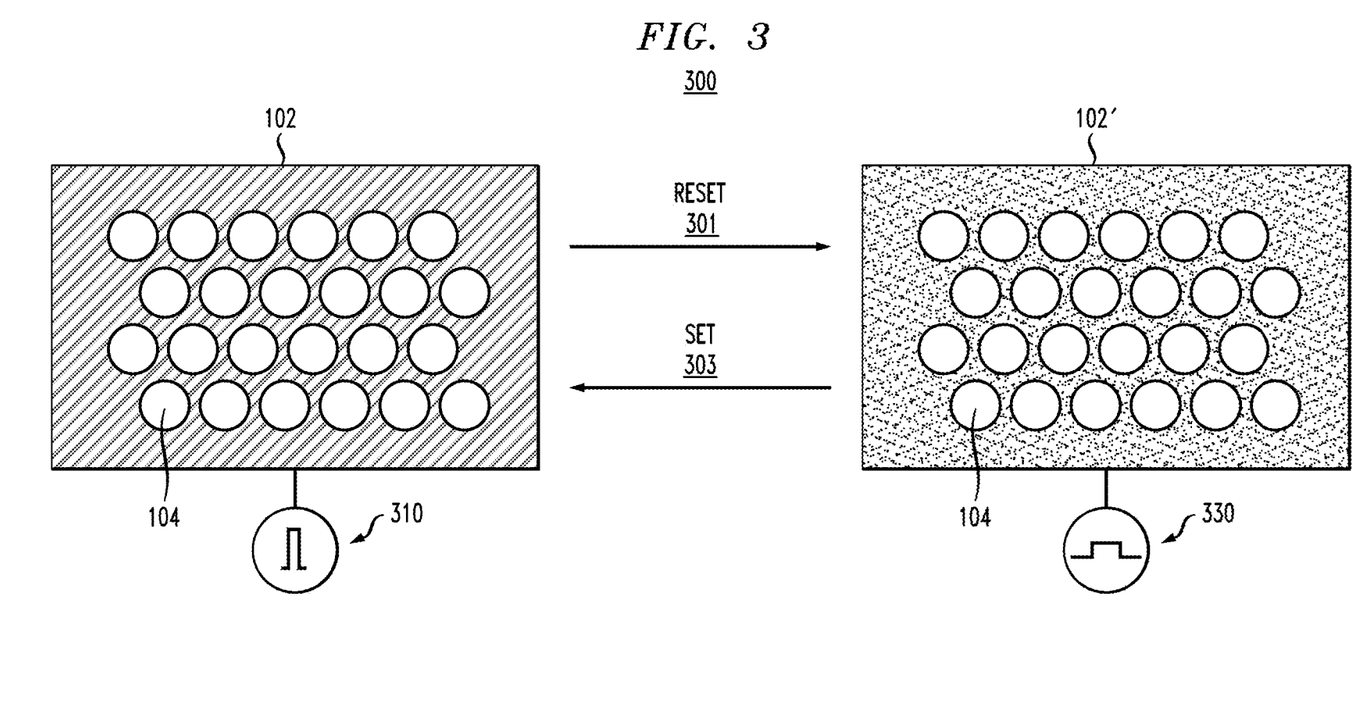
FIG. 3 depicts a process for dynamically reconfiguring a tunable hyperbolic metamaterial, according to an embodiment of the invention.

FIG. 3 shows a process 300 for dynamically reconfiguring the optical properties of a tunable hyperbolic metamaterial (e.g., such as the tunable hyperbolic metamaterial shown in FIGS. 1A-1B and 2A-2C). More particularly, the process 300 includes a "reset" operation 301 that converts the crystalline phase PCM 102 to an amorphous phase PCM 102', and a "set" operation 303 that converts the amorphous phase PCM 102' to the crystalline phase PCM 102. A relatively short, intense electrical pulse 310 is used to reset 301 the crystalline phase PCM 102 to the amorphous phase PCM 102'. A longer, less intense electrical pulse 330 is used to set 303 the amorphous phase PCM 102' to the crystalline phase PCM 102. The particular intensities and lengths of the electrical pulses 310 and 330 used in the reset 301 and set 303 operations may vary depending on the particular type of PCM or other optically tunable material used for the matrix 102. If the optically tunable material used for matrix 102 is $Sb_2Te_3$ or $Ge_2Sb_2Te_5$, the electrical pulse 310 may have an intensity of 5 Volts (V) and a duration of 50 nanoseconds (ns), and the electrical pulse 330 may have an intensity of 3V and a duration of 1 millisecond (ms).

Figure 4A:
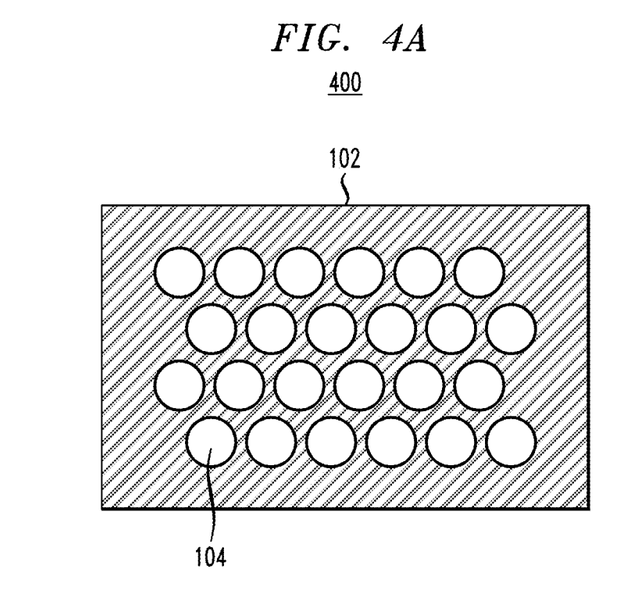
FIG. 4A depicts a side cross-sectional view of a tunable hyperbolic metamaterial with an optically tunable material formed around and between each of a plurality of metal nanowires, according to an embodiment of the invention.
Figure 4B:
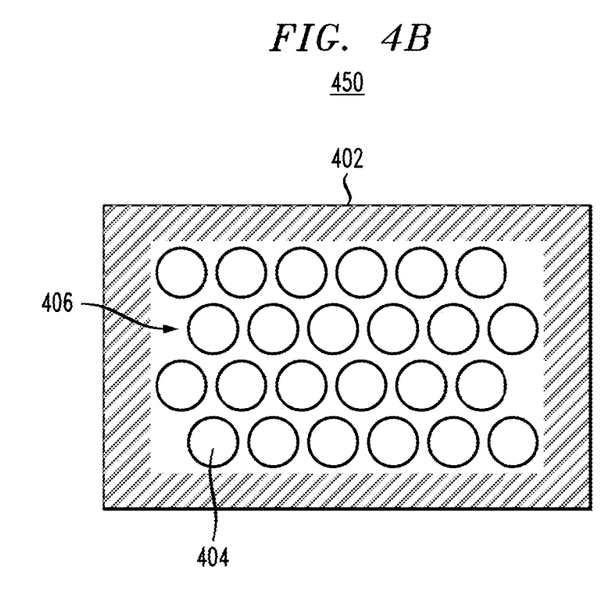
FIG. 4B depicts a side cross-sectional view of a tunable hyperbolic metamaterial with an optically tunable material formed around a plurality of metal nanowires, according to an embodiment of the invention.

FIGS. 4A and 4B show respective side cross-sectional views 400 and 450 of a tunable hyperbolic metamaterial. The side cross-sectional view 400 of FIG. 4A illustrates a tunable hyperbolic metamaterial where the metal nanowires 104 are spaced apart enough to allow the PCM 102 to intercalate with the array of metal nanowires 104. The side cross-sectional view 450 of FIG. 4B illustrates a tunable hyperbolic metamaterial where metal nanowires 104 are too closely packet for such intercalation. Thus, the PCM 402 surrounds the array of metal nanowires 404. In this case, a similar but moderately weaker tunable hyperbolic metamaterial effect is achieved.

Figure 5:
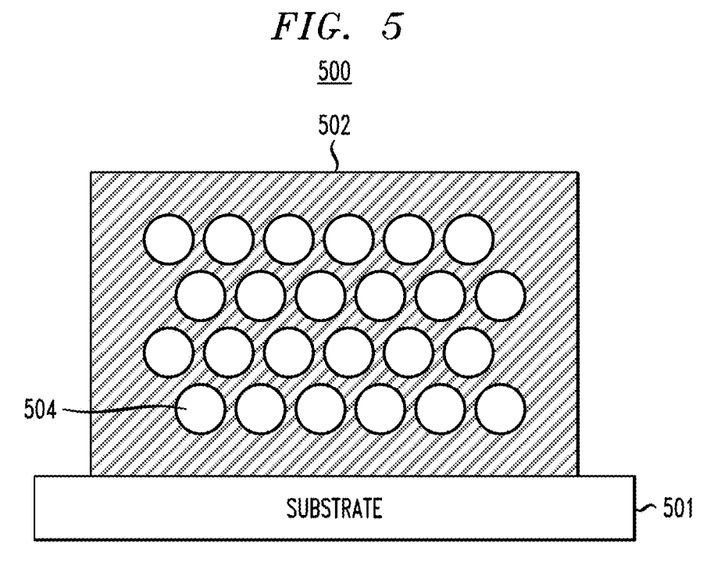
FIG. 5 depicts a side cross-sectional view of a tunable hyperbolic metamaterial with metal nanowires arranged in a plane of a substrate, according to an embodiment of the invention.
Figure 6:
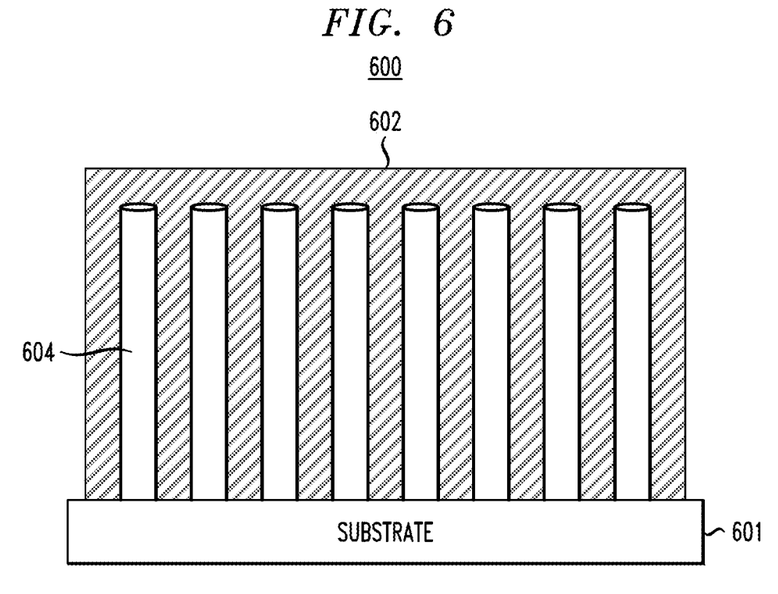
FIG. 6 depicts a side cross-sectional view of a tunable hyperbolic metamaterial with metal nanowires arranged out of plane of a substrate, according to an embodiment of the invention.

FIGS. 5 and 6 shows respective side cross-sectional views 500 and 600 of a tunable hyperbolic metamaterial, illustrating different orientations of metal nanowire arrays relative to a substrate. The side cross-sectional view 500 of FIG. 5 illustrates an array of metal nanowires 504 and PCM 502, where the array of metal nanowires 504 is "in the plane" of the substrate 501 (e.g., the metal nanowires 504 are parallel to or horizontally oriented relative to a top surface of the substrate 501). The side cross-sectional view 600 of FIG. 6 illustrates an array of metal nanowires 604 and PCM 602, where the array of metal nanowires 604 is "out of plane" of the substrate 601 (e.g., the metal nanowires 604 are perpendicular to or vertically oriented relative to a top surface of the substrate 601). The substrates 501 and 601 may be formed of silicon (Si), silicon dioxide ($SiO_2$), or another suitable material. The substrates 501 and 601 may each have a thickness in the range of 100 micrometers (μm) to 1 millimeter (mm). The tunable hyperbolic metamaterials shown in FIGS. 5 and 6 are both "type-I" hyperbolic metamaterials, in that the metamaterials of FIGS. 5 and 6 are metal-like in one dimension (e.g., along the axis of the nanowires 504/604) and are dielectric in the other two dimensions.

Figure 7:
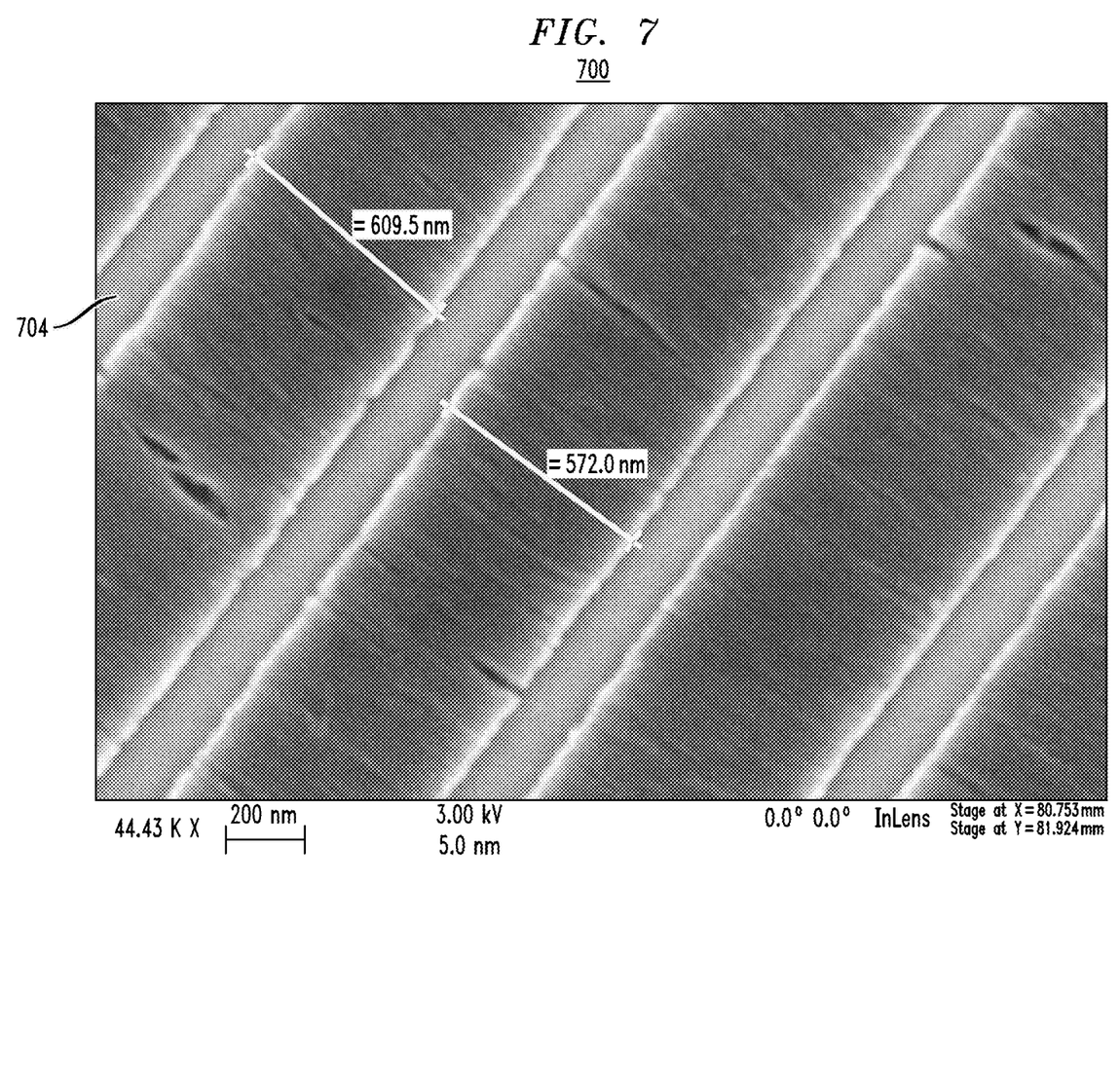
FIG. 7 depicts an image of carbon nanotubes aligned and crystallized in a two-dimensional array providing an antenna, according to an embodiment of the invention.
Figure 8:
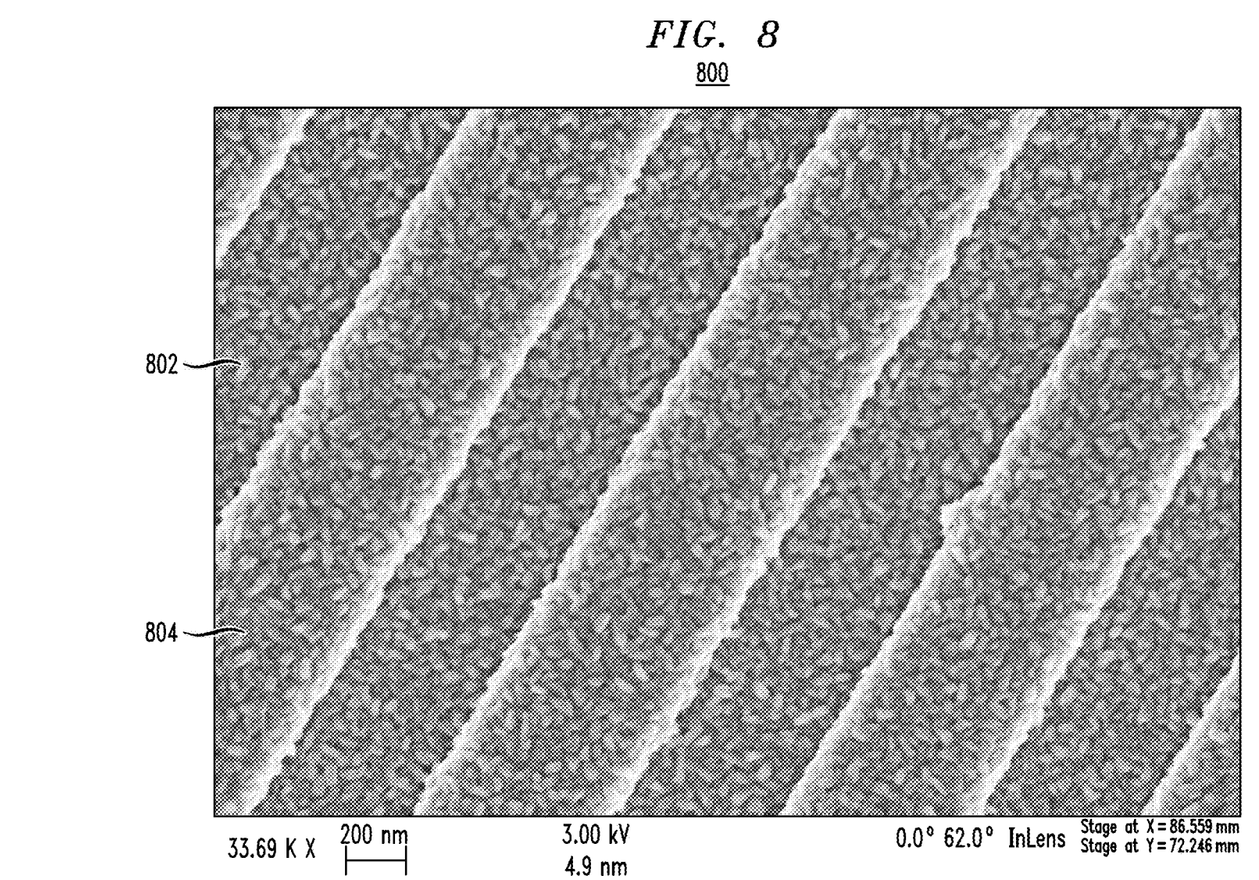
FIG. 8 depicts an image of carbon nanotubes aligned and crystallized in a two-dimensional array that are covered with a phase-change material providing a tunable hyperbolic metamaterial, according to an embodiment of the invention.
Figure 9:
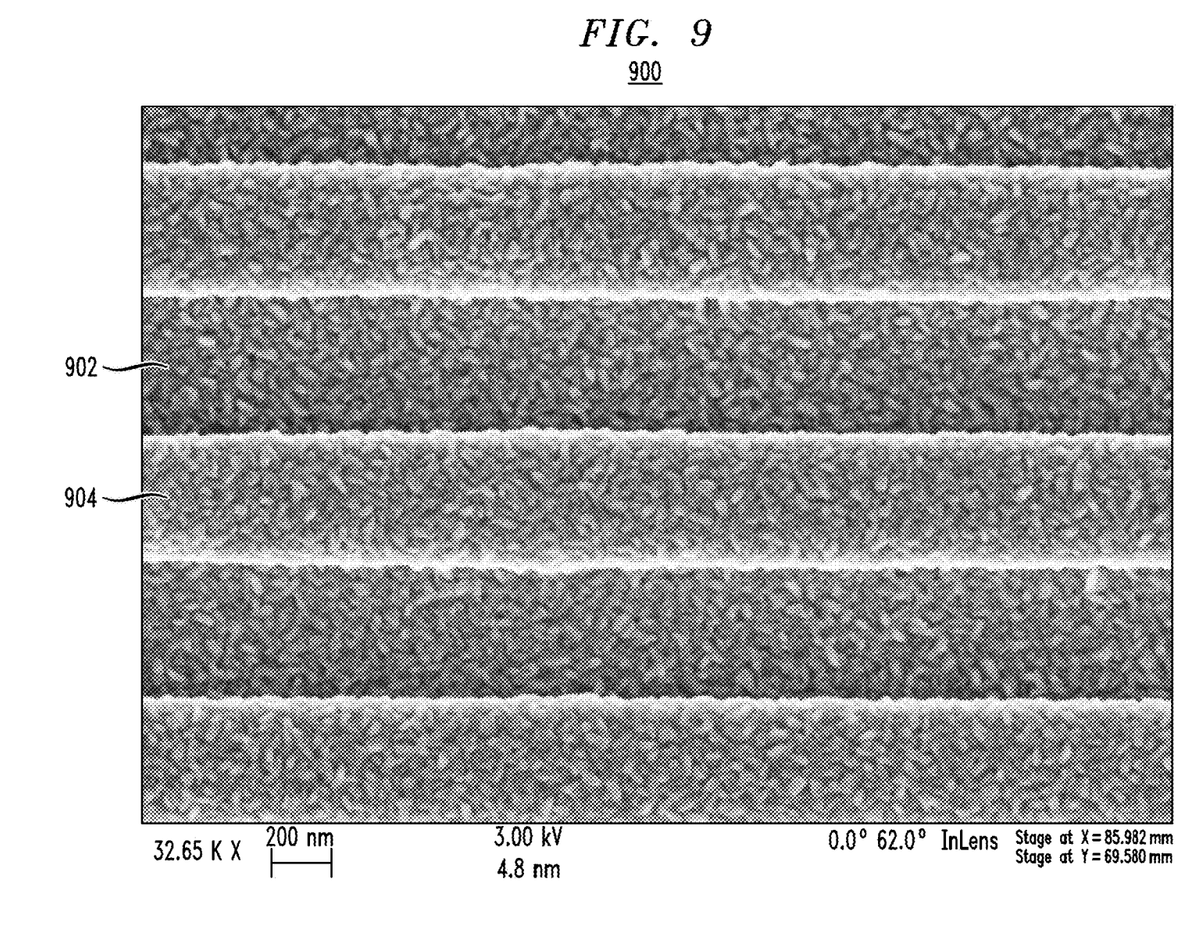
FIG. 9 depicts another image of carbon nanotubes aligned and crystallized in a two-dimensional array that are covered with a phase-change material providing a tunable hyperbolic metamaterial, according to an embodiment of the invention.

FIG. 7 shows a scanning electron micrograph image 700 of an antenna that comprises an etched film of carbon nanotubes 704 aligned and crystallized in a 2D array. FIGS. 8 and 9 show respective scanning electron micrograph images 800 and 900 of tunable hyperbolic metamaterials, each comprising an array of nanotubes 804, 904 aligned and crystallized as illustrated in FIG. 7, where the arrays of nanotubes 804, 904 are covered with a PCM 802, 902. In FIGS. 8 and 9, the PCM 802 and PCM 902 are assumed to be $Sb_2Te_3$, where the PCM 802 and PCM 902 are grown on the nanotubes 804 and nanotubes 904 using atomic layer deposition (ALD). It should be appreciated, however, that other deposition techniques, such as sputtering, may be used to grow the PCM 802 and PCM 902 on the nanotubes 804 and nanotubes 904. Although such other depositions techniques may be used, ALD is preferred in some embodiments because it is a conformal deposition technique. This means that the deposited PCM 802 and PCM 902 can intercalate in the array of nanotubes 804 and array of nanotubes 904.

As noted above, the PCM 802 and PCM 902 may be $Sb_2Te_3$. Details regarding the deposition of $Sb_2Te_3$ will now be provided. $Sb_2Te_3$ thin films may be deposited by ALD. The precursors used for this ALD process, in some embodiments, are antimony trichloride ($SbCl_3$) and hexamethyldisilyltellurium ($C_6H_{18}Si_2Te$). The $SbCl_3$ is kept at a temperature of 50 degrees Celsius (° C.), while the $C_6H_{18}Si_2Te$ is kept at a temperature of 25° C. These temperatures have been found to provide doses of precursor vapor that are sufficient for surface reaction saturation in the ALD process, though it should be appreciated that these exact temperatures are not required. Vapor of the precursors are alternatingly pulsed over the sample surface, with each vapor pulse followed by a purge with an inert gas, such as argon (Ar) or nitrogen ($N_2$). One ALD cycle of $Sb_2Te_3$ is defined as: (i) exposure of the sample to $C_6H_{18}Si_2Te$ vapor; (ii) purging of excess $C_6H_{18}Si_2Te$ vapor and reaction byproducts; (iii) exposure of the sample to $SbCl_3$ vapor; and (iv) purging of excess $SbCl_3$ vapor and reaction byproducts. Reaction of the precursor molecules with the sample surface is self-limiting, resulting in deposition of a single atomic layer of the constituent atoms per half cycle. The sample temperature used for this process is 30° C., with purging times of 30 seconds, 20 standard cubic centimeters per minute (sccm) of flowing purge gas (e.g., Ar), and a deposition chamber base pressure of 200 millitorr (mTorr). The growth rate of this reaction at this temperature is approximately 0.06 nanometers per cycle (nm/cycle). The resulting $Sb_2Te_3$ films are polycrystalline with resistivity of 0.015 milliohm centimeter (mΩ·cm).

Tunable hyperbolic metamaterials may be used for a wide variety of applications. FIGS. 10A-10B, 11A-11B and 12 illustrate three non-limiting example applications for tunable hyperbolic metamaterials.

Figure 10A:
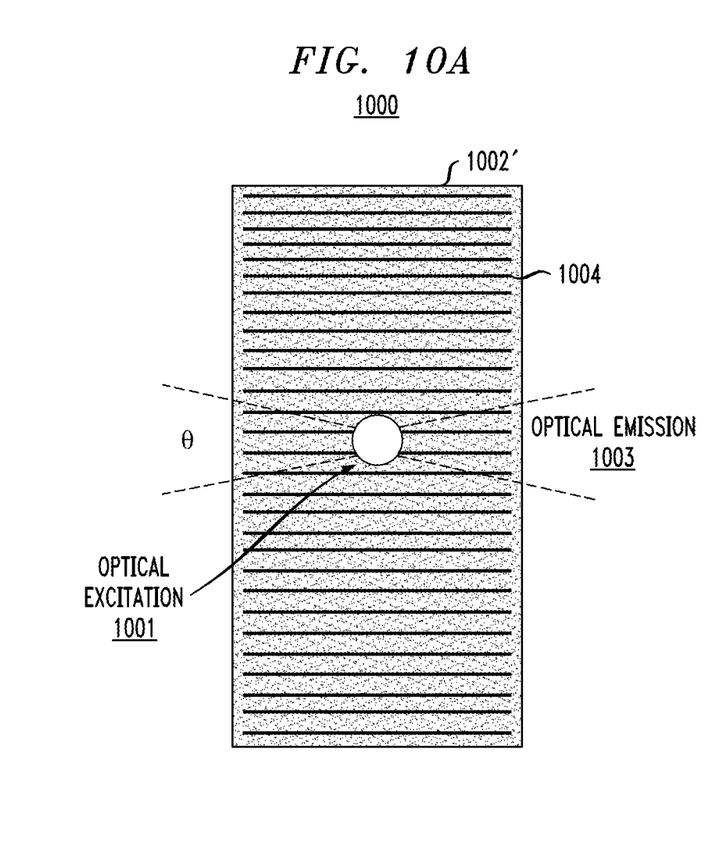
FIG. 10A depicts optical emission from a tunable hyperbolic metamaterial in a first configuration, according to an embodiment of the invention.
Figure 10B:
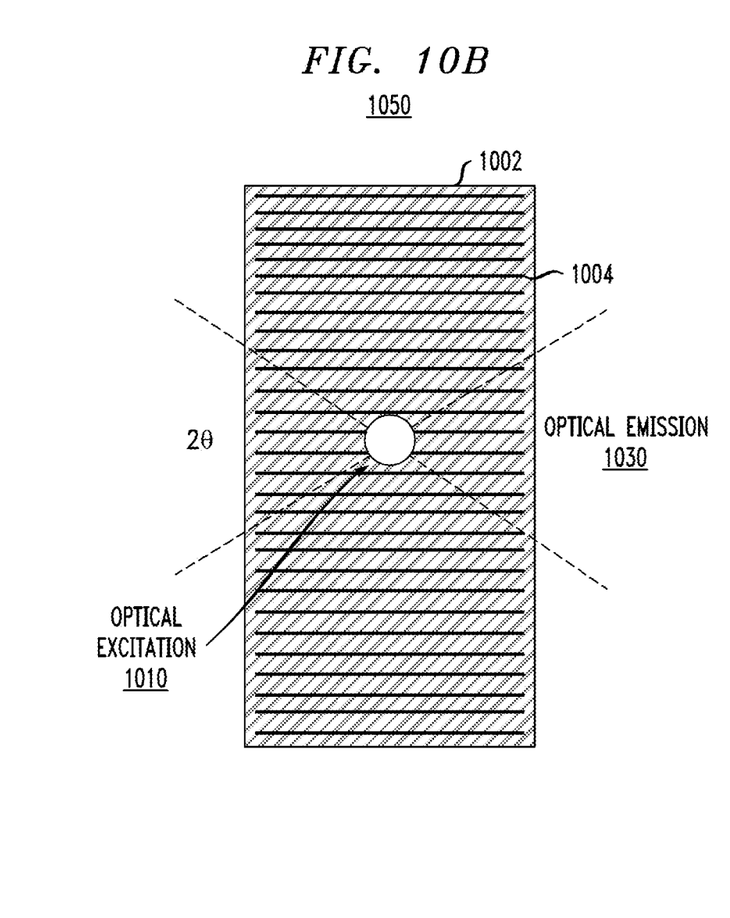
FIG. 10B depicts optical emission from a tunable hyperbolic metamaterial in a second configuration, according to an embodiment of the invention.

In isotropic optical materials, an emitter emits light isotropically. In hyperbolic metamaterials, the emission can be in a cone. The emission intensity can also be enhanced relative to that of an emitter in an isotropic optical material. FIGS. 10A and 10B illustrate respective views 1000 and 1050 of tunable hyperbolic metamaterials, each comprising an array of metal nanowires 1004 (e.g., carbon nanotubes) surrounded by a tunable optical material 1002/1002' (e.g., a chalcogenide PCM such as $Ge_2Sb_2Te_5$ (GST)). More particularly, view 1000 in FIG. 10A illustrates the array of metal nanowires 1004 surrounded by an amorphous phase PCM 1002', and the view 1050 in FIG. 10B illustrates the array of metal nanowires 1004 surrounded by a crystalline phase PCM 1002. When the phase of the GST providing the PCM is switched from amorphous 1002' to crystalline 1002, the angular distribution of the light emission is also switched (e.g., due to the changing optical properties of the hyperbolic metamaterial). This is illustrated by the optical excitation 1001 and optical emission 1003 for the amorphous PCM 1002' being different than the optical excitation 1010 and optical emission 1030 for the crystalline PCM 1002. More particularly, the width of the "cone" in view 1000 (e.g., θ, where θ is 30 degrees) is smaller than in view 1050 (e.g., 2θ, where θ is 30 degrees). The tunable hyperbolic metamaterial shown in FIGS. 10A and 10B provides an optical emitter, which may be any fluorophore, such as a fluorescent molecule or nanocrystal. The array of metal nanowires 1004 itself can serve as an optical emitter due to the presence of excitonic optical transitions in the metal nanowires 1004.

Figure 11A:
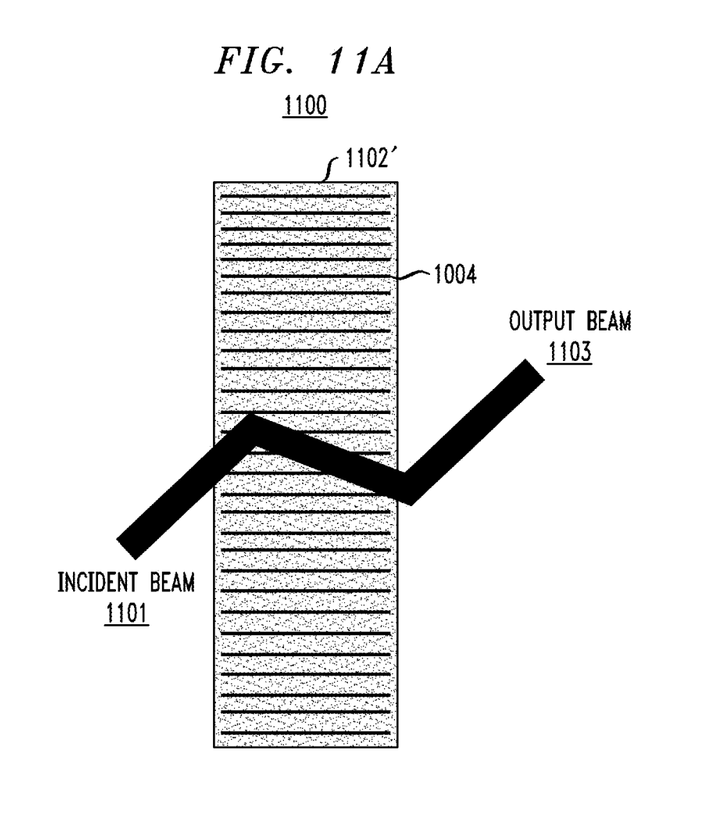
FIG. 11A depicts refraction of light from a tunable hyperbolic metamaterial in a first configuration, according to an embodiment of the invention.
Figure 11B:
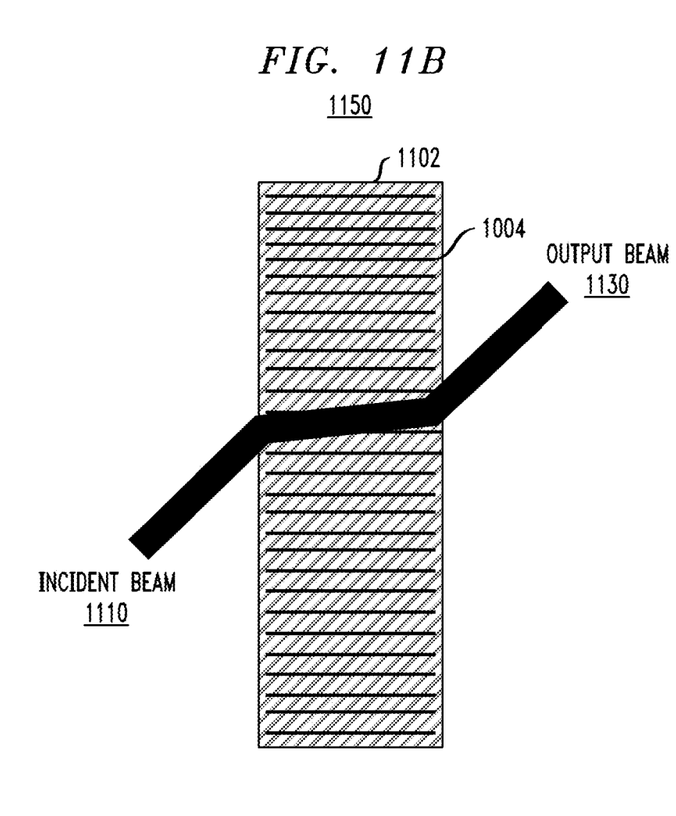
FIG. 11B depicts refraction of light from a tunable hyperbolic metamaterial in a second configuration, according to an embodiment of the invention.

Hyperbolic metamaterials can also exhibit negative refraction, where light is refracted in the opposite direction than it would be in a normal refraction material. FIGS. 11A and 11B illustrate respective views 1100 and 1150 of tunable hyperbolic metamaterials, each comprising an array of metal nanowires 1104 (e.g., carbon nanotubes) surrounded by a tunable optical material 1102/1102' (e.g., a chalcogenide PCM such as GST). More particularly, view 1100 in FIG. 11A illustrates the array of metal nanowires 1104 surrounded by an amorphous phase PCM 1102', and the view 1150 in FIG. 11B illustrates the array of metal nanowires 1104 surrounded by a crystalline phase PCM 1102. When the phase of the GST providing the PCM is switched from amorphous 1102' to crystalline 1102, the direction of optical refraction is actively switched as illustrated by the incident beams 1101 and 1110 and output beams 1103 and 1130 shown in the views 1100 and 1150, respectively.

Figure 12:
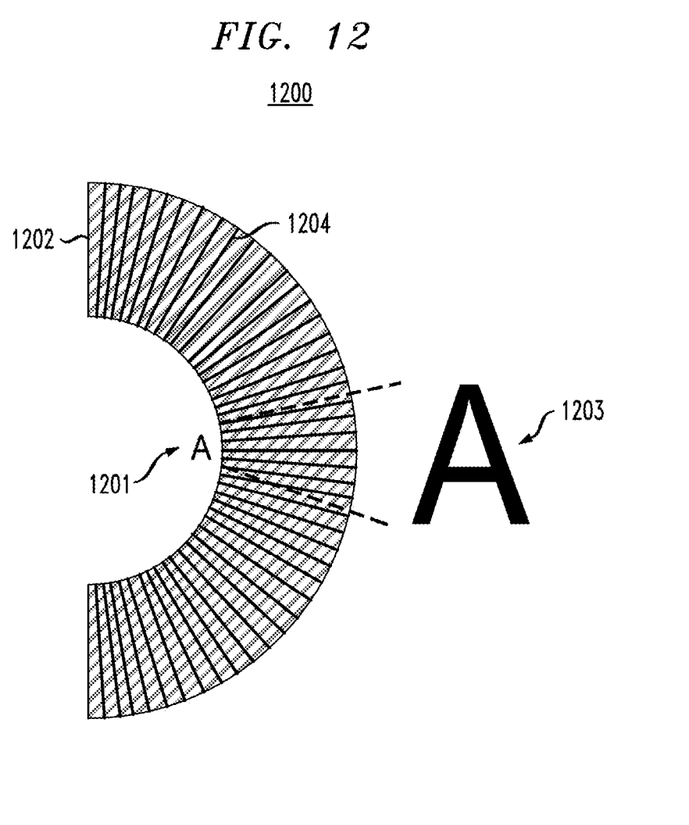
FIG. 12 depicts a tunable hyperbolic metamaterial providing a hyperlens, according to an embodiment of the invention.

Hyperbolic metamaterials may also function as hyperlenses or superlenses. Hyperlenses and superlenses allow for sharply imaging objects that would normally be blurry or invisible, due to the diffraction limit. FIG. 12 shows a view 1200 of a tunable hyperbolic metamaterial that comprises an array of metal nanowires 1204 (e.g., carbon nanotubes) surrounded by a tunable optical material 1202 (e.g., a PCM such as GST). The tunable hyperbolic metamaterial of FIG. 12 provides a hyperlens, allowing an object 1201 (e.g., "A") to be imaged or magnified 1203 as illustrated. By controlling the phase of the PCM 1202 (e.g., between amorphous and crystalline), the degree of magnification may be tuned.

In some embodiments, an apparatus comprises an array of metal nanowires embedded in a matrix of optically tunable material providing a tunable hyperbolic metamaterial, and a control circuit comprising (i) a current source coupled to first ends of the array of metal nanowires and (ii) a ground voltage coupled to second ends of the array of metal nanowires. The control circuit is configured to modify a state of the optically tunable material utilizing current supplied between the first and second ends of the array of metal nanowires to dynamically reconfigure optical properties of the tunable hyperbolic metamaterial.

Each of the metal nanowires in the array may have a designated length, and the tunable hyperbolic metamaterial may provide a hyperbolic metamaterial antenna.

The tunable hyperbolic metamaterial may provide an optical emitter having a designated cone of optical emission in response to an optical excitation, a width of the designated cone of optical emission being tunable by modifying the state of the optically tunable material.

The tunable hyperbolic metamaterial may provide a refractive medium having a designated direction of refraction for beams incident on a surface of the tunable hyperbolic metamaterial, the designated direction of refraction being tunable by modifying the state of the optically tunable material.

The tunable hyperbolic metamaterial may provide a hyperlens having a designated degree of magnification, the designated degree of magnification being tunable by modifying the state of the optically tunable material.

The array of metal nanowires may comprise an array of carbon nanotubes.

The optically tunable material comprises a chalcogenide PCM, and the control circuit may be configured to modify the state of the optically tunable material by providing a current between the first and second ends of the metal nanowires to heat the chalcogenide PCM to change a phase of the chalcogenide PCM from one of crystalline and amorphous to the other one of crystalline and amorphous.

In some embodiments, a semiconductor structure comprises a substrate, a matrix of optically tunable material disposed over the substrate, an array of metal nanowires embedded in the matrix of optically tunable material, a current source coupled to first ends of the array of metal nanowires, and a ground voltage coupled to second ends of the array of metal nanowires. The semiconductor structure provides a tunable hyperbolic metamaterial having one or more optical properties dynamically reconfigurable based on a state of the optically tunable material.

The metal nanowires may comprise carbon nanotubes.

The optically tunable material may comprise a chalcogenide PCM, and wherein the one or more optical properties of the tunable hyperbolic metamaterial are dynamically reconfigurable by heating the chalcogenide PCM to change the chalcogenide PCM between an amorphous and a crystalline phase. The chalcogenide PCM may comprise at least one of $Ge_xSb_yTe_z$, $Ge_xTe_y$, $Sb_xTe_y$, $Ag_xSb_yTe_z$, and $Ag_wIn_xSb_yTe_z$. The optically tunable material may alternatively comprise a metal-insulator transition material.

The optically tunable material may intercalate within the array of metal nanowires. The optically tunable material may alternatively surround the array of metal nanowires without intercalating the array of metal nanowires.

Each of the metal nanowires in the array of metal nanowires may be oriented parallel to a top surface of the substrate, or perpendicular to a top surface of the substrate.

In some embodiments, a method comprises selecting a designated set of one or more optical properties of a tunable hyperbolic metamaterial, the tunable hyperbolic metamaterial comprising an array of metal nanowires embedded in a matrix of optically tunable material. The method also comprises modifying a state of the optically tunable material utilizing current supplied between first and second ends of the array of metal nanowires to dynamically reconfigure the tunable hyperbolic metamaterial to have the designated set of one or more optical properties.

The metal nanowires in the array may comprise carbon nanotubes, and the optically tunable material may comprise a chalcogenide PCM. The chalcogenide PCM may comprise at least one of $Ge_xSb_yTe_z$, $Ge_xTe_y$, $Sb_xTe_y$, $Ag_xSb_yTe_z$, and $Ag_wIn_xSb_yTe_z$. Modifying the state of the optically tunable material may comprise providing the current between the first and second ends of the array of metal nanowires to heat the chalcogenide PCM to change a phase of the chalcogenide PCM from one of crystalline and amorphous to the other one of crystalline and amorphous.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   an array of metal nanowires embedded in a matrix of optically tunable material providing a tunable hyperbolic metamaterial; and
   a control circuit comprising (i) a current source coupled to first ends of the array of metal nanowires and (ii) a ground voltage coupled to second ends of the array of metal nanowires;
   wherein the control circuit is configured to modify a state of the optically tunable material utilizing current supplied between the first and second ends of the array of metal nanowires to dynamically reconfigure optical properties of the tunable hyperbolic metamaterial.

2. The apparatus of claim 1, wherein each of the metal nanowires in the array has a designated length, and wherein the tunable hyperbolic metamaterial provides a hyperbolic metamaterial antenna.

3. The apparatus of claim 1, wherein the tunable hyperbolic metamaterial provides an optical emitter having a designated cone of optical emission in response to an optical excitation, a width of the designated cone of optical emission being tunable by modifying the state of the optically tunable material.

4. The apparatus of claim 1, wherein the tunable hyperbolic metamaterial provides a refractive medium having a designated direction of refraction for beams incident on a surface of the tunable hyperbolic metamaterial, the designated direction of refraction being tunable by modifying the state of the optically tunable material.

5. The apparatus of claim 1, wherein the tunable hyperbolic metamaterial provides a hyperlens having a designated degree of magnification, the designated degree of magnification being tunable by modifying the state of the optically tunable material.

6. The apparatus of claim 1, wherein the array of metal nanowires comprises an array of carbon nanotubes.

7. The apparatus of claim 1, wherein the optically tunable material comprises a chalcogenide phase-change material, and wherein the control circuit is configured to modify the state of the optically tunable material by providing the current between the first and second ends of the metal nanowires to heat the chalcogenide phase-change material to change a phase of the chalcogenide phase-change material from one of crystalline and amorphous to the other one of crystalline and amorphous.

8. The apparatus of claim 7, wherein the chalcogenide phase-change material comprises at least one of germanium antinomy telluride, germanium telluride, antimony telluride and silver antimony telluride.

9. The apparatus of claim 1, wherein the optically tunable material comprises a metal-insulator transition material.

10. The apparatus of claim 1, wherein the optically tunable material intercalates within the array of metal nanowires.

11. The apparatus of claim 1, wherein the optically tunable material surrounds the array of metal nanowires without intercalating the array of metal nanowires.

12. A semiconductor structure comprising:
a substrate;
a matrix of optically tunable material disposed over the substrate;
an array of metal nanowires embedded in the matrix of optically tunable material;
a current source coupled to first ends of the array of metal nanowires; and
a ground voltage coupled to second ends of the array of metal nanowires;
wherein the semiconductor structure provides a tunable hyperbolic metamaterial having one or more optical properties dynamically reconfigurable based on a state of the optically tunable material.

13. The semiconductor structure of claim 12, wherein the metal nanowires comprise carbon nanotubes.

14. The semiconductor structure of claim 12, wherein the optically tunable material comprises a chalcogenide phase-change material, and wherein the one or more optical properties of the tunable hyperbolic metamaterial are dynamically reconfigurable by heating the chalcogenide phase-change material to change the chalcogenide phase-change material between an amorphous and a crystalline phase.

15. The semiconductor structure of claim 14, wherein the chalcogenide phase-change material comprises at least one of germanium antinomy telluride, germanium telluride, antimony telluride and silver antimony telluride.

16. The semiconductor structure of claim 12, wherein the optically tunable material comprises a metal-insulator transition material.

17. The semiconductor structure of claim 12, where the optically tunable material intercalates within the array of metal nanowires.

18. The semiconductor structure of claim 12, wherein the optically tunable material surrounds the array of metal nanowires without intercalating the array of metal nanowires.

19. The semiconductor structure of claim 12, wherein each of the metal nanowires in the array of metal nanowires is oriented parallel to a top surface of the substrate.

20. The semiconductor structure of claim 12, wherein each of the metal nanowires in the array of metal nanowires is oriented perpendicular to a top surface of the substrate.

* * * * *